United States Patent
Brauer

(10) Patent No.: US 7,049,171 B2
(45) Date of Patent: May 23, 2006

(54) ELECTRICAL PACKAGE EMPLOYING SEGMENTED CONNECTOR AND SOLDER JOINT

(75) Inventor: Eric A. Brauer, Avon, IN (US)

(73) Assignee: Delphi Technologies, Inc., Troy, MI (US)

( * ) Notice: Subject to any disclaimer, the term of this patent is extended or adjusted under 35 U.S.C. 154(b) by 32 days.

(21) Appl. No.: 10/874,661

(22) Filed: Jun. 23, 2004

(65) Prior Publication Data

US 2005/0287699 A1    Dec. 29, 2005

(51) Int. Cl.
*H01L 21/44* (2006.01)
(52) U.S. Cl. ............................................. 438/106
(58) Field of Classification Search ............... 438/106, 438/108
See application file for complete search history.

(56) References Cited

U.S. PATENT DOCUMENTS

| | | | |
|---|---|---|---|
| 5,081,520 A * | 1/1992 | Yoshii et al. ............... | 257/702 |
| 5,523,620 A | 6/1996 | Eytcheson et al. .......... | 257/690 |
| 5,930,601 A * | 7/1999 | Cannizzaro et al. ........ | 438/122 |
| 6,054,765 A | 4/2000 | Eytcheson et al. .......... | 257/724 |
| 6,436,730 B1 * | 8/2002 | Melton et al. .............. | 438/108 |
| 6,566,164 B1 | 5/2003 | Glenn et al. ................ | 438/107 |
| 2003/0113954 A1 | 6/2003 | Glenn et al. ................ | 438/124 |

* cited by examiner

*Primary Examiner*—Scott Geyer
(74) *Attorney, Agent, or Firm*—Stefan V. Chmielewski

(57) ABSTRACT

An electronic package is provided having a connector and a solder joint that is less susceptible to thermal fatigue. The package includes a die including a first electrically conductive connecting surface having a first coefficient of thermal expansion and a substrate including electrical circuitry and a second electrically conductive connecting surface having a second coefficient of thermal expansion. The package further includes a solder joint connecting the first connecting surface to the second connecting surface. One of the first and second connecting surfaces includes a plurality of pads spaced from each other. By employing an electrical connection having a plurality of pads spaced from each other, the solder joint is relieved to reduce fatigue caused by thermal cycling.

14 Claims, 3 Drawing Sheets

ELECTRICAL PACKAGE EMPLOYING SEGMENTED CONNECTOR AND SOLDER JOINT

TECHNICAL FIELD

The present invention generally relates to electrical circuit connections, and more particularly relates to the electrical connection of a die onto a substrate, such as a circuit board.

BACKGROUND OF THE INVENTION

Electronic packages commonly employ various surface mount electronic devices assembled onto electrical circuitry on a printed circuit board. The printed circuit board generally includes a dielectric substrate (e.g., organic resin reinforced by fibers) and single or multiple layers of electrically conductive circuit traces. Many circuit boards include contact pads for solder connecting components to the electrical circuitry on the circuit board.

Some power electronic circuits require the use of silicon bare die components soldered directly to substrate materials. The choice of materials typically employed in these applications are generally limited by the need for high thermal performance properties and a coefficient of thermal expansion (CTE) closely matched to the silicon bare die components. Examples of some substrate materials include aluminium nitride (ALN), silicon nitride (SiN), or beryllium oxide (BeO). The circuit design flexibility using these substrate materials is generally limited and the materials are generally costly.

Due to the low cost and high conductivity of copper, it is generally desirable to attach the silicon bare die directly to a copper tab or to a copper pad on a circuit board substrate. However, because of the large coefficient of thermal expansion mismatch between the copper and the silicon die, the solder joint of a silicon die used in power electronics generally may not successfully survive thermal cycling. Solder joint failures may result during temperature excursions encountered during normal operating cycles, particularly when used in the automotive environment. The large temperature fluctuations in the electronic package experienced with continuous power cycles generally produces fatigue in the solder joints. This cyclical thermal fatigue may result in sheer stress fatigue of the solder joint, especially when combined with vibrations.

It is therefore desirable to provide for an electronic package having a die to copper substrate connection that is less susceptible to thermal fatigue. In particular, it is desirable to provide for an electrical connection that allows the use of high powered die components to be soldered onto a copper circuit on a substrate, in a manner that is less susceptible to adverse affects caused by variations in the thermal coefficient of expansion of the interconnecting materials.

SUMMARY OF THE INVENTION

According to one aspect of the present invention, an electronic package is provided that has a solder joint that is less susceptible to thermal fatigue. The package includes a die including a first electrically conductive connecting surface having a first coefficient of thermal expansion and a substrate including electrical circuitry and a second electrically conductive connecting surface having a second coefficient of thermal expansion. The package further includes a solder joint connecting the first connecting surface to the second connecting surface. One of the first and second connecting surfaces includes a plurality of connecting pads spaced from each other. By employing an electrical connection having a plurality of pads spaced from each other, the solder joint is stress relieved to reduce the likelihood of fatigue caused by thermal cycling.

According to another aspect of the present invention, a segmented electrical connector is provided for connecting electrical circuitry to a die. The connector includes a carrier defining an array of multiple regions, and an electrically conductive terminal comprising a conductive material formed in the multiple regions of the carrier. The conductive material exhibits a first coefficient of thermal expansion. The connector further includes a solder joint disposed on the carrier and the conductive material to connect the terminal to a contact surface on a die exhibiting a second coefficient of thermal expansion that is different from the first coefficient of thermal expansion.

According to a further aspect of the present invention, a method of forming an electrical connection between a die and substrate is provided. The method includes the steps of providing a die having a contact surface, forming a carrier defining multiple regions isolated from each other, and forming a plurality of electrically conductive contact pads within the plurality of regions of the carrier. The method also includes the steps of disposing solder between the plurality of contact pads and the contact surface of the die, and curing the solder to form a connection between the contact surface of the die and the individual contact pads.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
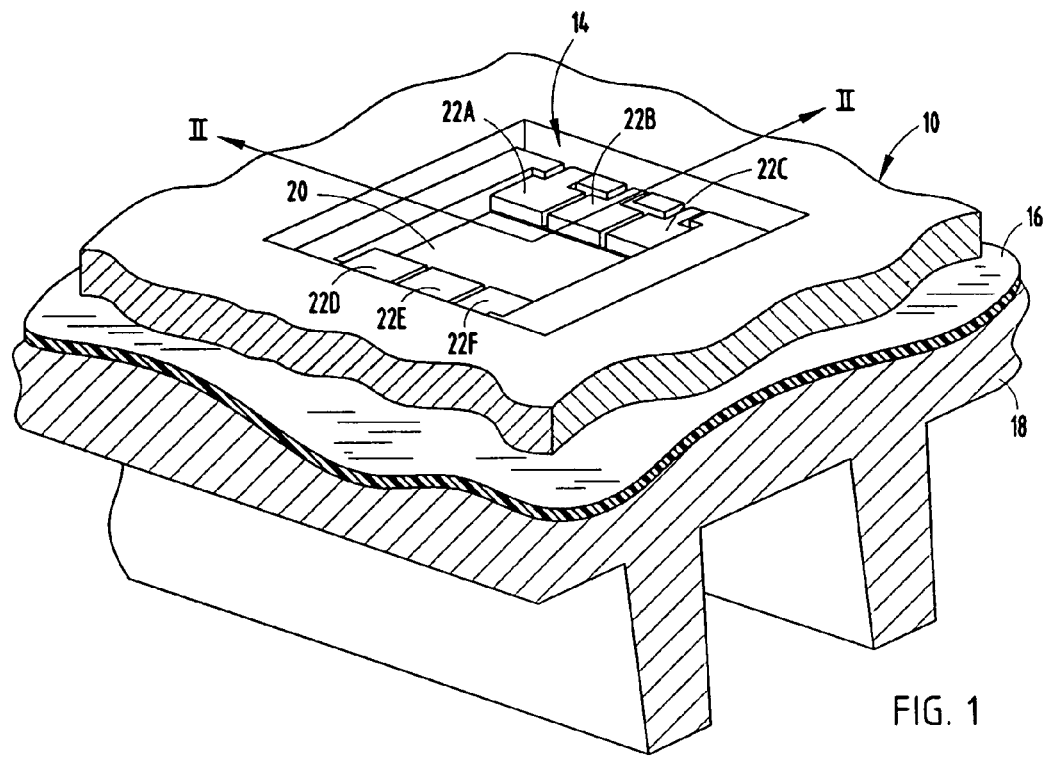
FIG. 1 is a partial perspective view of an electronic package employing a silicon die soldered to a substrate via a segmented copper connector according to the present invention.
Figure 2:
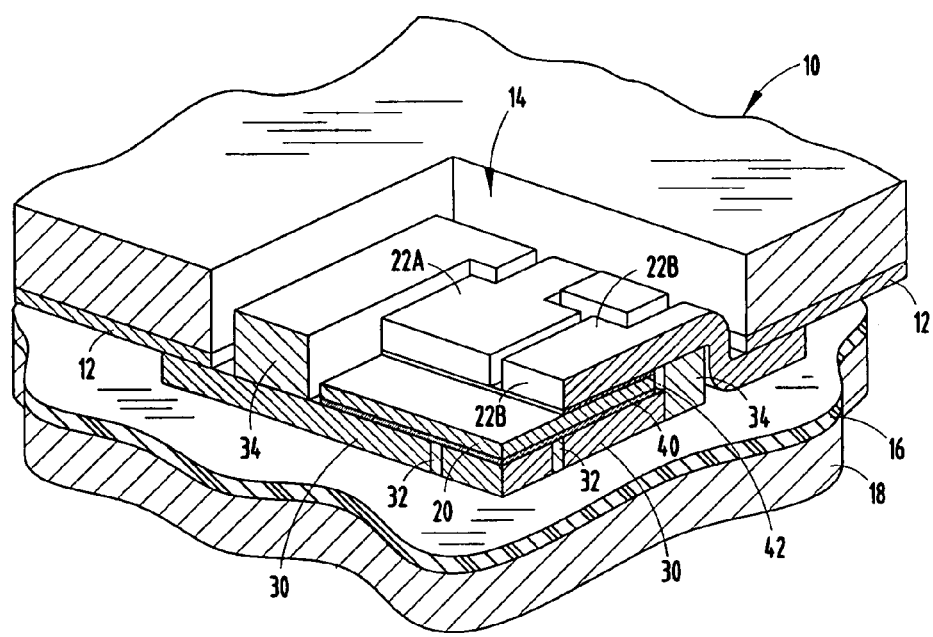
FIG. 2 is a cross-sectional view of the electronic package taken through lines II—II of FIG. 1.
Figure 3:
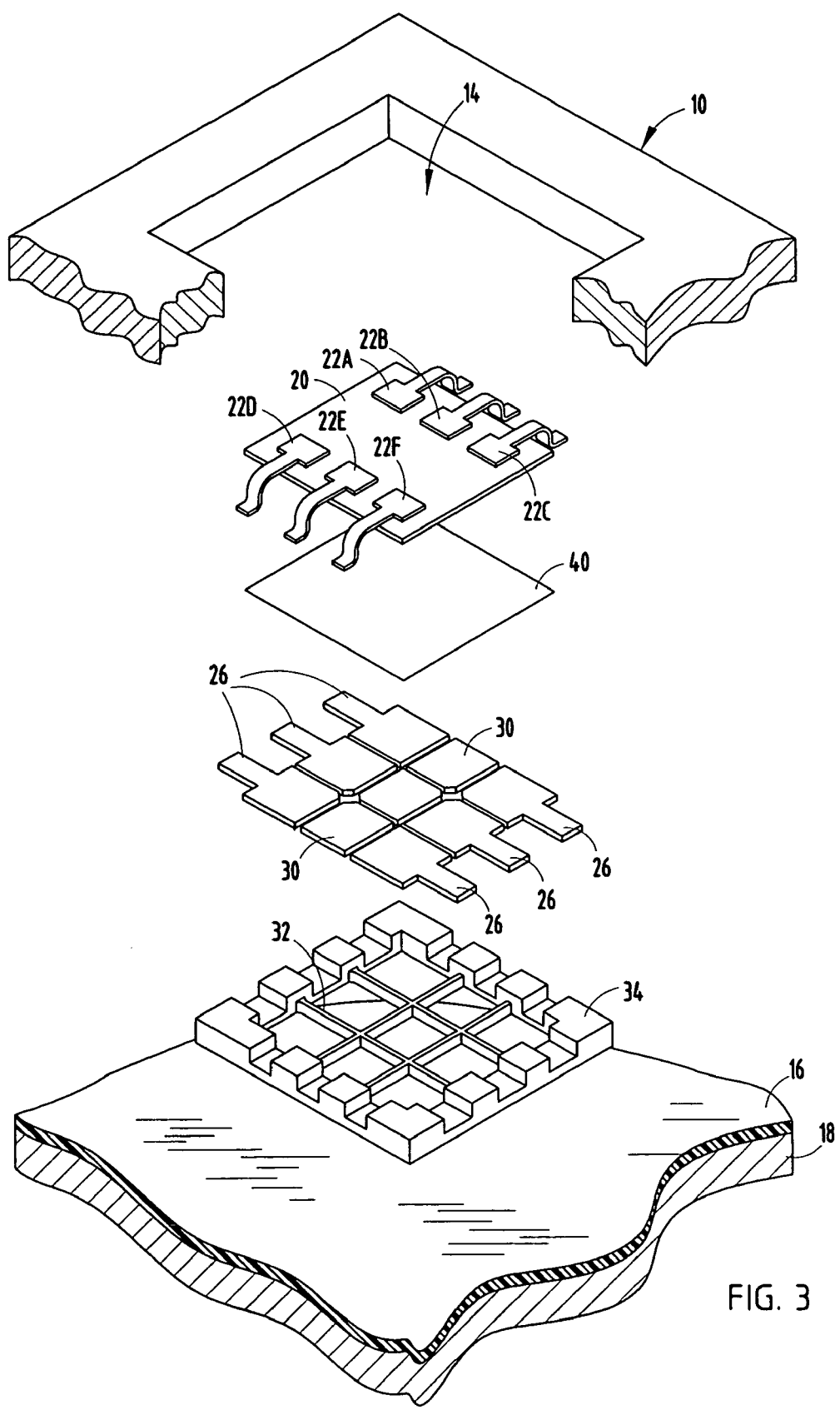
FIG. 3 is an exploded view of the electronic package shown in FIG. 1.

Referring to FIGS. 1–3, an electronic package is generally illustrated having a silicon bare die 20 soldered to a segmented copper connecting terminal 30 on a substrate 10. The substrate 10 is shown having a cavity 14 formed in the top surface for receiving a solder connected die 20, such as a semiconductor component. The printed electrical circuitry 12 of substrate 10 is connected to the connecting terminal 30 attached to the electronic package by solder connection to the bare die 20.

The substrate 10 with electrical circuitry 12 may include a printed circuit board, according to one embodiment. The substrate 10 may include any known substrate material, such as FR4 or ceramic material, and may be provided as a laminated circuit board, such as a printed circuit board having printed circuitry as is generally known in the art. According to another embodiment, substrate 10 may include a wiring board. It should be appreciated that substrate 10 may include electrical circuitry 12 in intermediate layers and/or on the bottom and top surfaces. The recessed cavity 14 allows for placement of the electronic package with the bare die 20, such as a semiconductor device, to be mounted on the substrate 10 and electrically connected to the segmented electrical connecting terminal 30 according to the present invention.

In one embodiment, the die 20 is a large silicon bare die exhibiting a first coefficient of thermal expansion, and the electrical connecting terminal 30 is a segmented material made substantially of copper and exhibiting a second coefficient of thermal expansion. The first and second coefficients of thermal expansion are substantially different values. According to one example, the silicon die has a coefficient of thermal expansion of about 3 ppm/° C., and the copper connecting terminal has a coefficient of thermal expansion of about 17 ppm/°C. According to other embodiments, the die 20 may include other electrically conductive materials including silicon carbide (SiC), gallium nitride, germanium, germanium silicon, and germanium arsenide, while the connecting terminal 30 may include any suitable electrically conductive materials used to electrically connect the bare die surfaces to the circuitry of the substrate 10. Alternative examples of connecting terminal 30 materials could be brass, aluminium, bronze, electrically conductive plastics or plated plastics, plated ceramics, and plated or clad steel.

Disposed between silicon die 20 and copper connecting terminal 30 is solder joint 40. The solder joint 40 may include a low temperature eutectic solder that is heated to reflow and form a mechanical bond. In one embodiment, the eutectic solder is provided as a paste or as a preformed sheet applied sheet between the die 20 and segmented connecting terminal 30 and is heated to an elevated temperature such that the solder material transitions from a solid state to a semi-liquid state so that the solder reflows and, when subsequently cooled, the solder solidifies to form a rigid solder joint 40. The solder joint 40 not only provides an electrical circuit path, but also provides a mechanical connection of the die 20 and the segmented electrical connecting terminal 30 to substrate 10. The solder joint 40 may include any of a number of known solder pastes such as eutectic solder. Examples of commercially available solder pastes include Kester 958 and 951D, Alpha RF800 and NR300 A2, and Heraeus F365. According to another embodiment, the solder joint 40 may include conductive adhesives, such as polymer-based conductive adhesives.

The present invention employs a segmented electrical connecting terminal 30 employing an array of multiple copper pads spaced from each other via a carrier 34 having divider members 32 defining an array of regions in a manner that reduces stress on the solder joint 40 which may otherwise be present during cyclical loading conditions. Thus, the present invention provides for a novel way to successfully solder attach a large silicon die 20 to a copper terminal 30 on a substrate 10.

The segmented copper terminal 30 as seen in FIG. 3 includes an array of multiple copper pads in the form of chips disposed within the array of regions defined by the carrier 34 and spaced from each other via the carrier divider members 32. According to one embodiment, the carrier 34 and its divider members 32 are made of liquid crystal polymer (LCP) plastic exhibiting a third coefficient of thermal expansion that is substantially equal to the first coefficient of thermal expansion. While the connecting terminal 30 is shown including nine (9) copper pads (chips), it should be appreciated that any of a plurality of segmented pads formed in a like number of carrier regions may be employed.

The segmented electrical connecting terminal 30 serves as an electrical current transmission path to transmit electrical current between die 20 and interconnecting electrical circuitry to substrate 10. Extending on opposite ends of connecting terminal 30 are six terminals 26, which connect to electrical circuitry on the substrate 10 and serve as current transmission paths. The six terminals 26 may be electrically coupled together via circuitry on substrate 10 such that electrical current is divided amongst terminals 26 and is distributed across segmented connecting terminal 30.

Also shown disposed on top of bare die 20 are a plurality of connecting terminals 22A–22E. Terminals 22A–22E are soldered to the top surface of bare die 20 via a solder joint 42 which provides an electrical and mechanical connection therebetween. While each terminal 22A–22E is shown as a single pad, it should be appreciated that each of terminals 22A–22E may be formed as a segmented connector having a carrier and multiple copper pads similar to the electrical connection formed between the bottom surface of die 20 and terminal 30. Terminals 22A–22E are likewise connected to electrical circuitry on substrate 10. In the example shown, terminals 22A–22E extend onto electrical circuitry extending on the bottom surface of substrate 10.

The silicon die 20 may include any of a number of semiconductor devices, such as a switch including a field effect transistor (FET). According to one example, one or more of terminals 22A–22E may be coupled to a source, and one or more of the remaining connecting terminals 22A–22E may be coupled to a gate, while the bottom surface of die 20 may serve as a drain, when the bare die 20 is FET. The segmented electrical connector 30 achieved with the present invention is particularly well suited when the die 20 is required to transmit high electrical current, which may result in large temperature fluctuations during continuous cyclical powering conditions.

The electrical package may also include a heat sink 18 disposed in heat transfer relationship with the lower surface of copper connecting terminal 30 and substrate 10. The heat sink 18 may be formed by stamping sheet metal, such as aluminium alloy, to form upstanding cooling fin pedestals. The heat sink 18 may be adhered to the bottom surface of copper terminal 30 and thereby to substrate 10 via a thermally conductive and dielectric adhesive layer 16. Thus, the heat sink 18 serves to dissipate heat away from the die 20 and the solder joint 40 to minimize the cyclical temperature fluctuations that may otherwise be experienced.

While the segmented copper terminal 30 is shown connected to the bottom contacting surface of bare die 20, it should be appreciated that the segmented connecting terminal 30 made of a plurality of copper chips and carrier 34 may be employed on the upper contacting surface to connect any of terminals 22A–22E to the upper surface of die 20.

Figure 4:
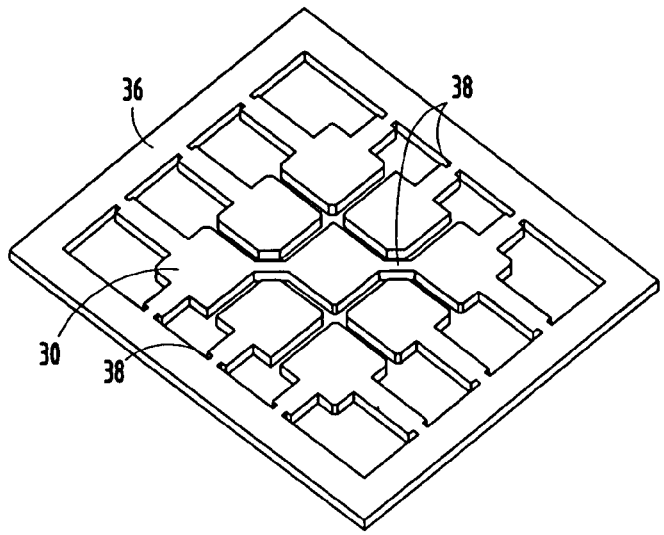
FIG. 4 is a perspective view of a copper grid and lead frame used for forming the array of copper pads for use as an electrical connecting terminal.
Figure 5:
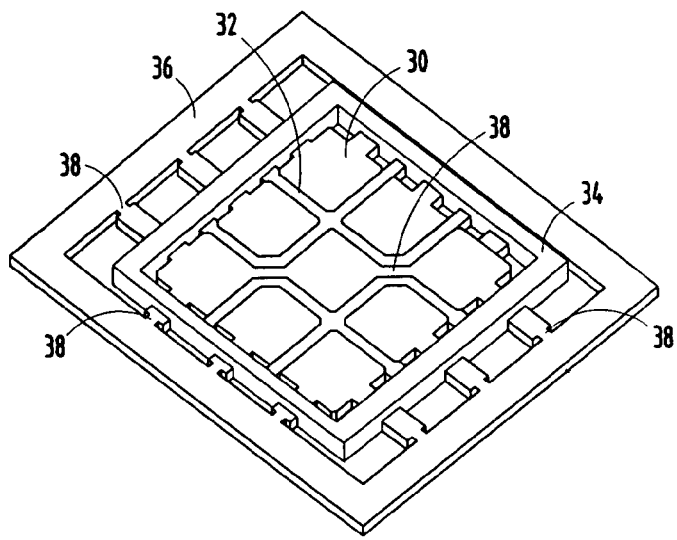
FIG. 5 is a perspective view of the copper pads and lead frame further shown with a liquid crystal polymer (LCP) plastic carrier.
Figure 6:
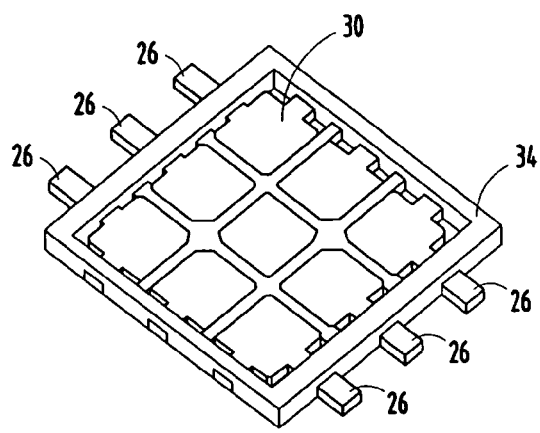
FIG. 6 is a perspective view of the carrier and copper pads with the outer lead frame removed to provide the electrical connecting terminal.

Referring to FIGS. 4–6, the formation of the segmented copper terminal 30 is generally illustrated therein according to one embodiment. As seen in FIG. 4, an array of copper pads 30 are shown separated yet held together via an outer copper lead frame 36 and interconnecting segments 38. The array of copper pads 30 may be formed by a stamping, etching, EDM, or similar cutting and separating methods. The copper pads 30 including an exterior lead frame 36 are then disposed in a molding machine, where the LCP plastic carrier 34 including divider members 32 is formed as seen in FIG. 5. The interconnecting segments 38 are punched out (removed) and the outer copper lead frame 36 is then separated and removed to arrive at the segmented electrical connector terminal shown in FIG. 6.

It should be appreciated that the array of copper pads (chips) 30 are separated from each other such that the copper pads 30 are soldered to die 20 so that each individual copper pad 30 independently bonds to the interconnecting solder joint 40 and bottom connecting surface of die 20. By combining multiple copper pads 30 in array in close proximity and maintaining their position with the carrier 34, a substrate of mostly copper material for contacting the die 20 and heat sink 18 can be created which minimizes the resultant stress that may be experienced during cyclical temperature fluctuations.

The number, size, and arrangement of the copper pads 30 assembled in a flat array, may be determined through finite element modelling and considering the maximum allowable solder joint stress. The copper terminal 30 can be designed by changing the number of segmented copper pads 30 in the assembly to accept any size silicon die 20 including a large die required for power electronics applications.

The carrier 34 and its divider members 32 has a coefficient of thermal expansion closely matched to that of a silicon die 20, such that the carrier frame 34 is confined and each copper pad 30 acts independently during expansion and contraction. Therefore, the resulting stresses in the solder joint 40 are maintained at an acceptable level. As a result, the total copper area is substantial and provides good contact area for soldering the die 20 to the copper pads 30 and is superior thermal path to the heat sink 18 can be mounted against the opposite side of the substrate and segmented copper pads 30.

Accordingly, the electrical connection achieved with the segmented terminal 30 according to the present invention advantageously provides enhanced mechanical and electrical connection which minimizes stress caused by cyclical fluctuations which may result from large fluctuations in temperature, particularly when used in an automotive environment.

The use of the segmented connecting terminal 30 realizes an enhanced electrical connection achieved at a low cost and allows for mass termination of multiple components and enhanced flexibility to integrate power circuitry with other control circuitry.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What is claimed is:

1. A method of forming an electrical connection between an electrically conductive contact surface of a die and a substrate, said method comprising the steps of:
    providing a die having an electrically conductive contact surface;
    forming a carrier defining multiple regions isolated from each other;
    forming a plurality of electrically conductive contact pads in the multiple regions of the carrier, wherein the plurality of electrically conductive pads form an electrical connecting terminal;
    disposing a solder material between the plurality of contact pads and the electrically conductive contact surface of the die; and
    curing the solder so as to form a connection between the electrically conductive contact surface of the die and the individual contact pads.

2. The method as defined in claim 1, wherein the step of forming the plurality of electrically conductive contact pads comprises forming an array of copper regions.

3. The method as defined in claim 1, wherein the step of providing a die comprises providing a die comprising silicon.

4. The method as defined in claim 1, wherein the step of forming a carrier comprises forming a carrier comprised of liquid crystal polymer plastic material.

5. The method as defined in claim 1, wherein the step of curing the solder comprises heating a sheet of solder to an elevated temperature to reflow the solder sheet and cooling the reflowed solder.

6. The method as defined in claim 1, wherein the step of forming a carrier comprises forming dividers that define and isolate the multiple regions.

7. The method as defined in claim 1, wherein the die comprises a field effect transistor.

8. The method as defined in claim 1, wherein the die comprises a first material exhibiting a first coefficient of thermal expansion and the electrical connecting terminal comprises a material exhibiting a second coefficient of thermal expansion that is different than the first coefficient of thermal expansion.

9. The method as defined in claim 8, wherein the carrier comprises a third material exhibiting a third coefficient of thermal expansion that is substantially equal to the second coefficient of thermal expansion.

10. The method as defined in claim 1 further comprising the step of disposing a heat sink in thermal relationship with the electrically conductive contact pads.

11. A method of forming an electrical connection between a die and a substrate, said method comprising the steps of:
    providing a die having an electrically conductive contact surface and comprising a first material exhibiting a first coefficient of thermal expansion;
    forming a carrier defining multiple regions isolated from each other;
    forming an electrical connecting terminal having a plurality of electrically conductive contact pads disposed in the multiple regions of the carrier, said electrical connecting terminal comprising a second material exhibiting a second coefficient of thermal expansion that is different than the first coefficient of thermal expansion;
    disposing a solder material between the electrical connecting terminal and the electrically conductive contact surface of the die; and
    curing the solder to form a connection between the electrical conductive contact surface of the die and the electrical connecting terminal.

12. The method as defined in claim 11, wherein the step of forming the electrical connecting terminal comprises forming a plurality of copper pads.

13. The method as defined in claim 11, wherein the step of forming the carrier comprises forming dividers that define and isolate the multiple regions.

14. The method as defined in claim 11, wherein the carrier comprises a third material exhibiting a third coefficient of thermal expansion that is substantially equal to the second coefficient of thermal expansion.

* * * * *